United States Patent
Rangarajan et al.

(10) Patent No.: US 6,579,733 B1
(45) Date of Patent: Jun. 17, 2003

(54) USING SCATTEROMETRY TO MEASURE RESIST THICKNESS AND CONTROL IMPLANT

(75) Inventors: Bharath Rangarajan, Santa Clara, CA (US); Bhanwar Singh, Morgan Hill, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/196,407

(22) Filed: Jul. 16, 2002

Related U.S. Application Data

(62) Division of application No. 10/050,732, filed on Jan. 16, 2002.

(51) Int. Cl.[7] .............................................. H01L 21/66
(52) U.S. Cl. .............................. 438/14; 438/15; 438/16
(58) Field of Search ...................... 438/14–16; 356/445, 356/305; 430/30

(56) References Cited

U.S. PATENT DOCUMENTS

| | | | |
|---|---|---|---|
| 4,963,501 A | 10/1990 | Ryan et al. | |
| 5,343,293 A | 8/1994 | Berger et al. | |
| 5,880,838 A | 3/1999 | Marx et al. | |
| 6,051,349 A * | 4/2000 | Yoshioka et al. | 430/30 |
| 6,052,188 A | 4/2000 | Fluckiger et al. | |
| 6,104,486 A | 8/2000 | Arimoto | |
| 6,173,240 B1 | 1/2001 | Sepulveda et al. | |
| 6,259,521 B1 * | 7/2001 | Miller et al. | 356/237.5 |
| 6,350,397 B1 | 2/2002 | Heikkila et al. | |
| 6,383,824 B1 | 5/2002 | Lensing | |
| 6,423,977 B1 * | 7/2002 | Hayasaki et al. | 250/559.19 |
| 6,433,878 B1 * | 8/2002 | Niu et al. | 356/603 |
| 6,458,605 B1 * | 10/2002 | Stirton | 438/7 |
| 6,477,662 B1 * | 11/2002 | Beffa et al. | 714/7 |
| 6,479,309 B1 * | 11/2002 | Wright | 438/16 |

OTHER PUBLICATIONS

"An Integrated System of Optical Metrology for Deep Sub–Micron Lithography", XINHUI NIU, A dissertation submitted in partial satisfaction of the requirements for the degree of Doctor of Philosphy in Engineering–Electrical Engineering and Computer Sciences in the Graduate Division of the University of California, Berkeley, Spring, 1999, 153 pp., Call #308t, 1999, 324.

"Scatterometry of the Measurement of Metal Features", in METROLOGY, INSPECTION, AND PROCESS CONTROL FOR MICROLITHOGRAPHY XIV; Christopher J. Raymond, Steve W. Farrer and Scott Sucher, Proceedings o SPIE, vol. 3998, pp. 135–145.

(List continued on next page.)

*Primary Examiner*—John F. Niebling
*Assistant Examiner*—Olivia Luk
(74) *Attorney, Agent, or Firm*—Eschweiler & Associates, LLC

(57) ABSTRACT

The present invention provides systems and methods wherein scatterometry is used to control an implant processes, such as an angled implant process. According to the invention, data relating to resist dimensions is obtained by scatterometry prior to an the implant process. The data is used to determine whether a resist is suitable for an implant process and/or determine an appropriate condition, such as an angle of implant or implantation dose, for an implant process.

22 Claims, 6 Drawing Sheets

OTHER PUBLICATIONS

"Manufacturing Considerations for Implementation of Scatterometry for Process Monitoring", In METROLOGY, INSPECTION, AND PROCESS CONTROL FOR MICROLITHOGRAPHY XIV; John Allgair, Dave Benoit, Rob Hershey and Lloyd C. Litt (Motorola); Ibrahim Abdulhalim, Bill Braymer, Michael Faeyrman, John C. Robinson, Umar Whitney, Yiping Xu, Piotr Zalicki and Joel Seligson (Kla–Tencor Corp) Proceedings of SPIE, vol. 3998 (2000) pp. 125–134.

"Phase Profilometry for the 193 nm Lithography Gate Stack", In METROLOGY, INSPECTION, AND PROCESS CONTROL FOR MICROLITHOGRAPHY XIV, Nickhil Jakatdar, Xinhui Niu, Junwei Bao, Costas Spanos, Sanjay Yedur and Alain Deleporte, Proceedings of SPIE, vol. 3998 (2000), pp. 116–124.

"Lithographic Process Monitoring using Diffraction Measurements", In METROLOGY, INSPECTION, AND PROCESS CONTROL FOR MICROLITHOGRAPHY XIV, Emmanuel M. Drege and Dale M. Byrne, Proceedings of SPIE, vol. 3998 (2000), 12 pgs.

* cited by examiner

USING SCATTEROMETRY TO MEASURE RESIST THICKNESS AND CONTROL IMPLANT

RELATED APPLICATION

This application is a divisional of Ser. No. 10/050,732 filed Jan. 16, 2002, which is entitled "USING SCATTEROMETRY TO MEASURE RESIST THICKNESS AND CONTROL IMPLANT".

TECHNICAL FIELD OF THE INVENTION

The present invention relates generally to semiconductor device manufacturing and more particularly to systems and methods for controlling implants.

BACKGROUND OF THE INVENTION

In the semiconductor industry, there is a continuing trend toward high device densities. To achieve these high device densities, small features on semiconductor wafers are required. These may include the width and spacing of interconnecting lines, spacing and diameter of contact holes, and spacing and width of doped regions of a substrate, such as regions that form buried bit lines in a memory array.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as visible light, ultraviolet light, x-rays, or an electron beam) through an intervening master template, the mask or reticle (the terms mask and reticle are used interchangeably herein), forming a particular pattern. Exposed areas of the coating become either more or less soluble than the unexposed areas, depending on the type of coating, in a particular solvent developer. The more soluble areas are removed with the developer in a developing step. The less soluble areas remain on the silicon wafer forming a patterned resist. The pattern of the resist corresponds to the image, or negative image, of the reticle.

One application of a patterned resist is in doping a semiconductor substrate. The resist can mask parts of the semiconductor substrate while other parts are implanted, thereby forming P-N junctions, for example. The dopants can be implanted by bombarding the resist coated substrate with energetic dopant ions. If the dopants have an angle of incidence that is nearly perpendicular with respect to the substrate, the ions become implanted in a pattern that corresponds to the gaps in the resist coating.

Optionally, however, the dopants can bombard the substrate at an angle of incidence that is not perpendicular, as illustrated in FIG. 1. Such angled implantation has a number of applications. One application is providing diffused sources and drains. Another application, illustrated in FIG. 1, is providing narrowly spaced P-N junctions. As illustrated in FIG. 1, angled implants can be used to provide periodically spaced n-doped regions 12 in a p-doped substrate 10, for example. The n-doped regions 12 are provided by implants at two mirror image angles, and one of the angles is illustrated by the arrows in FIG. 1. As can be seen in FIG. 1, there are two n-doped regions 12 for each gap in the patterned resist 14. Thus, angled implants can provide periodic n-doped regions having half the smallest period achievable by the lithographic process used to pattern the resist 14.

The size and spacing of the n-doped regions 12 within the substrate 10 depends on the thickness and gap width of the resist 14 in addition to the angle of implantation. Variability in the resist 14 can cause the n-doped regions 12 to form improperly. For example, FIG. 2 illustrates the result of an angled implant with a patterned resist 24 that is approximately 25% thinner than the resist 14 of FIG. 1. In FIG. 2, adjacent n-doped regions 22 are essentially unseparated for the same angled implantation. FIG. 3 illustrates the result of an angled implant with a patterned resist 34 that is approximately 25% greater that the resist 14 of FIG. 1. In FIG. 3, approximately none of the dopant reaches substrate 30 for the same angled implantation, and n-doped regions do not form. Variation in resist thickness between the extremes of FIGS. 2 and 3 can thus result in non-functionality or non-uniform functionality for devices relying on angled implants.

Uncontrolled variations in lithographic processes make providing resists with consistent dimensions very difficult. Variations that affect resist dimensions can occur, for example, in spin coating resists, pre-baking resists, exposing resists, post-baking resists, and developing resists. While process control strategies can reduce these variations, they continue to be present in production processes. Thus, there remains an unsatisfied need for practical systems and methods that reduce, eliminate, and/or compensate for variations in resists that affect the outcome of angled implant processes.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The primary purpose of this summary is to present some concepts of the invention in a simplified form as a prelude to the more detailed description that is presented later.

The present invention provides systems and methods wherein scatterometry is used to control implant processes. According to the invention, data relating to resist dimensions is obtained by scatterometry prior to an implant process. The data is used to determine whether a resist is suitable for an implant process and/or determine an appropriate condition, such as an angle of implant or an implantation dosage.

Other advantages and novel features of the invention will become apparent from the following detailed description of the invention and the accompanying drawings. The detailed description and drawings provide exemplary embodiments of the invention. These exemplary embodiments are indicative of but a few of the various ways in which the principles of the invention can be employed.

DETAILED DESCRIPTION OF THE INVENTION

Figure 1:
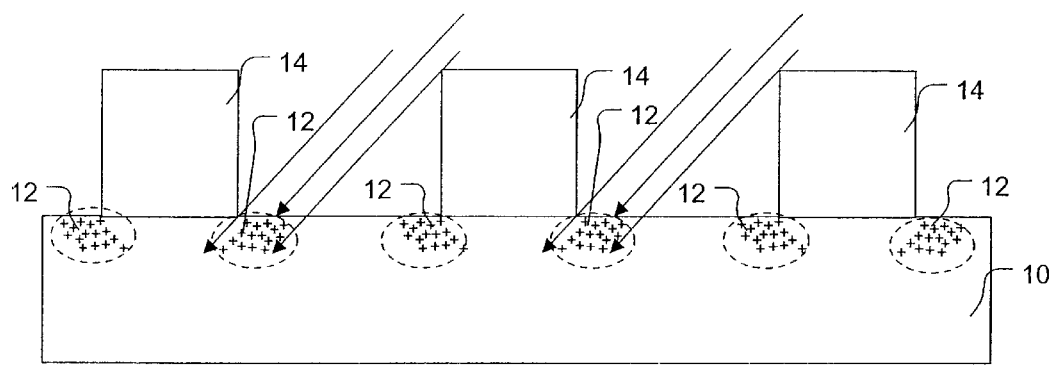
FIG. 1 is an illustration of an angled implant process.
Figure 2:
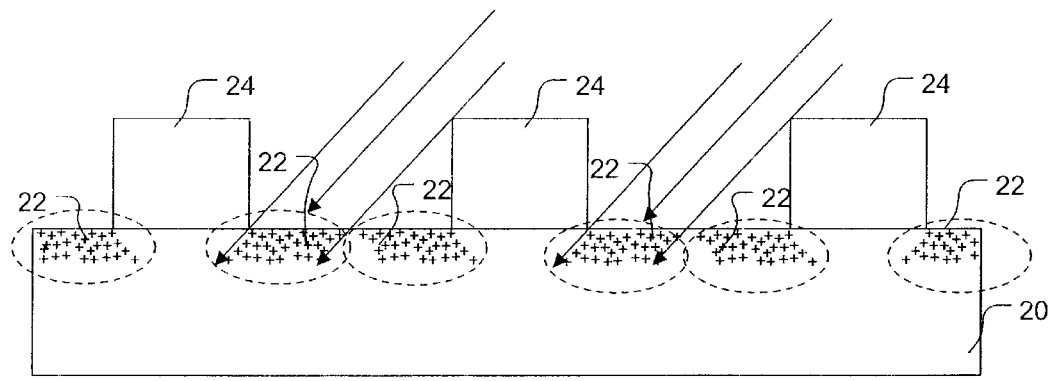
FIG. 2 is an illustration of an angled implant process where the resist is too thin for the angle of implant used.
Figure 3:
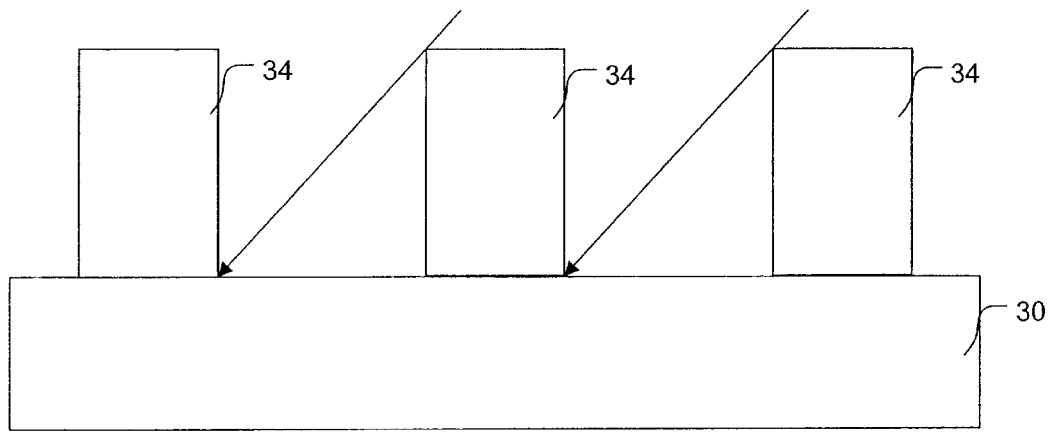
FIG. 3 is an illustration of an angled implant process where the resist is too thick for the angle of implant used.
Figure 4:
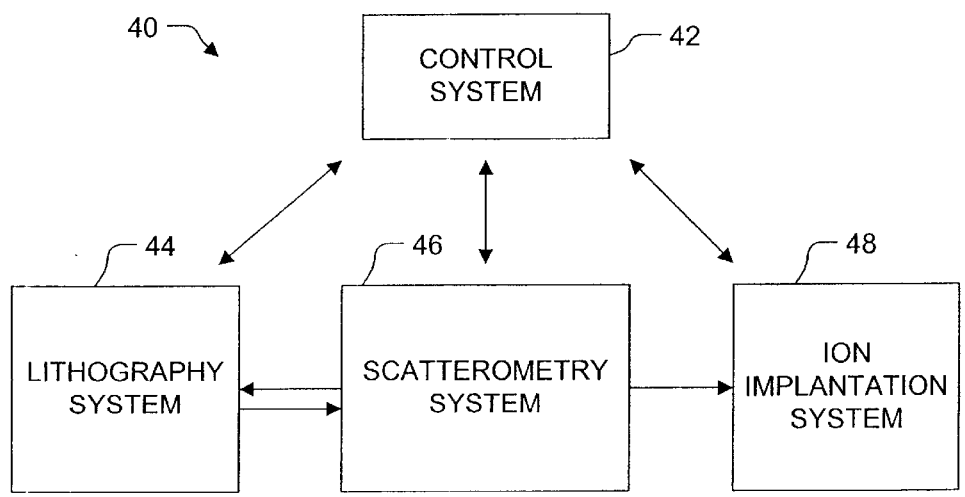
FIG. 4 is a high level schematic of a system according to one aspect of the present invention.

The present invention will now be described with reference to the drawings. FIG. 4 is a high level schematic of a semiconductor processing system 40 according to one aspect of the present invention. The semiconductor processing system 40 includes a control system 42, a lithography system 44, a scatterometry system 46, and an ion implantation system 48. The lithography system 44 provides semiconductor substrates with a patterned resist thereon, and the scatterometry system 46 obtains scatterometry data from the patterned resist. The control system 42 analyzes the scatterometry data and determines therefrom whether the patterned resist is suitable for an implant process and/or determines a condition to use in the implant process. The ion implantation system 48 then applies the implant to the semiconductor substrate, optionally using a condition determined by the control system 42.

A semiconductor substrate comprises, for example, a semiconductor, typically silicon. Other examples of semiconductors include GaAs and InP. In addition to a semiconducting material, the substrate may include various elements therein and/or layers thereon; including metal layers, barrier layers, dielectric layers, device structures, active elements and passive elements including silicon gates, word lines, source regions, drain regions, bit lines, bases emitters, collectors, conductive lines, conductive vias, etc.

Figure 5:
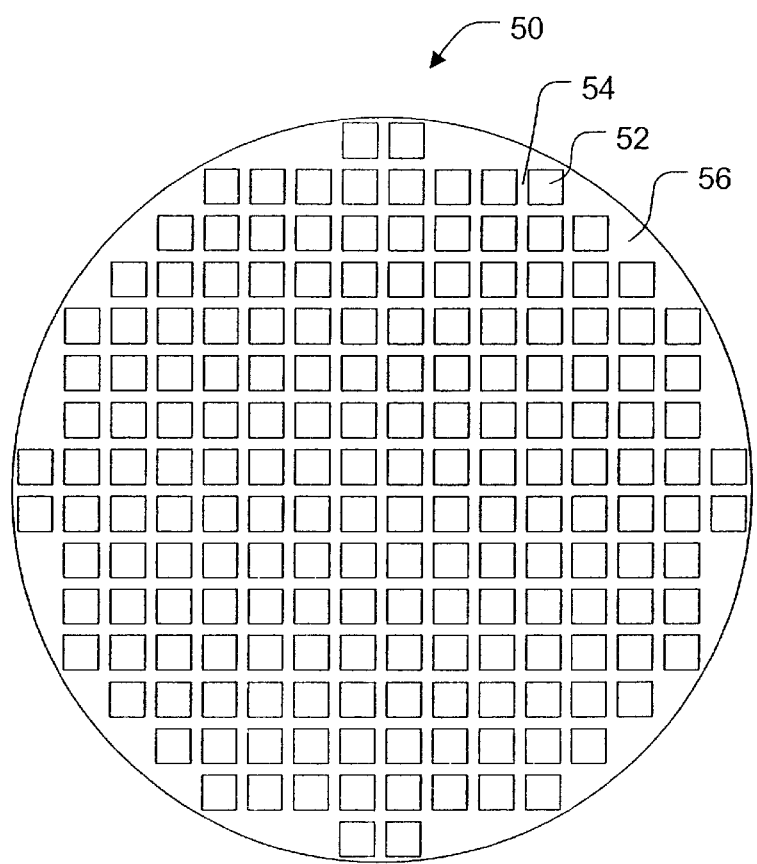
FIG. 5 is an illustration of a wafer substrate.

The semiconductor substrate is generally in the form of a wafer. FIG. 5 illustrates an exemplary wafer 50. The wafer 50 includes a plurality of rectangular functional regions 52, wherein devices are formed, and non-functional regions 54, which will be referred to as the scribe lines 54 which are located adjacent and between the functional regions 52. The wafer 50 also includes nonfunctional regions 56 around the periphery.

The lithography system 44 can include, without limitation, any of the standard equipment for forming patterned resist coatings. Such equipment can include, for example, spin coating apparatus, a stepper, baking apparatus, and developing apparatus. The lithography system 44 applies a resist coating to the substrate and patterns the coating. Patterning is the process of selectively exposing the resist to actinic radiation through a reticle and developing the resist. Exposing the resist is generally a repetitive process, wherein a stepper causes selective exposure through the reticle of the resist in each of the functional regions 52, one at a time. While the reticle is generally printed to the functional regions 52, a portion of the reticle can also print to an adjacent nonfunctional region. In one embodiment of the invention, the reticle prints a grating in a non-functional portion of the resist, for example, in the scribe lines 54. The grating can be used to facilitate obtaining scatterometry data.

The resist coating applied by the lithography system 44 can be organic or inorganic. The resist can be, for example, a photoresist responsive to visible light, ultraviolet light, or x-rays, or the resist can be an electron beam resist or an ion beam resist. A positive or negative tone resist can be used. Examples of resists include novalacs, poly-t-butoxycarbonyloxystyrenes (PBOCOS), poly-methylmethacrylates (PMMA), poly(olephin sulfones) (POS), and poly(methyl isophenyl ketones) (PMIPK). The resist may also be chemically amplified. Resists are commercially available from a number of sources, including Shipley Company, Kodak, Hoechst Celanese Corporation, Clariant, JSR Microelectronics, Hunt, Arch Chemical, Aquamer, and Brewer.

The lithography system 44 can coat the substrate 50 with the resist by any suitable means. Spin coating, dip coating, or vapor deposition can be used, depending on the coating material. For example, a 157 nm sensitive photoresist, a 193 nm sensitive photoresist, an I-line, H-line, G-line, E-line, mid UV, deep UV, or extreme UV photoresist may be spin-coated on the semiconductor substrate surface.

In one embodiment, the lithography system 44 provides a resist coating that is from about 200 Å to about 20,000 Å thick. In another embodiment, the resist coating is from about 500 Å to about 10,000 Å thick. In a further embodiment, the resist coating is from about 1,800 Å to about 4,000 Å thick.

Figure 6:
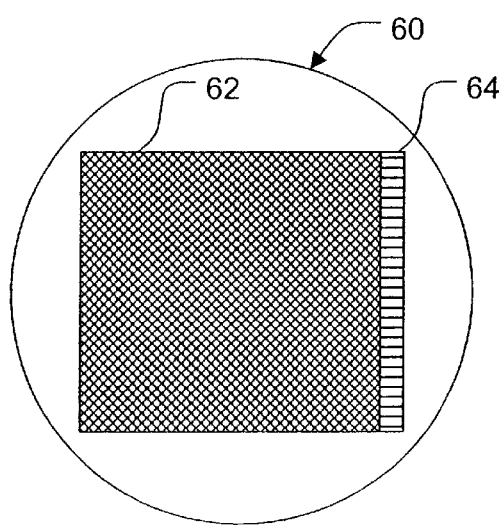
FIG. 6 is an illustration of a reticle that provides a grating pattern to facilitate scatterometry measurements.

The lithography system 44 can be equipped with a reticle that provides the resist with a grating that is adapted to facilitate obtaining scatterometry data. FIG. 6 provides an example of a reticle 60 with a substantially rectangular principle portion 62 and an adjacent edge portion 64. The principle portion 62 has a reticle pattern corresponding to a plurality of desired structures in a functional region 52 of the wafer 50. The edge portion 64 has a grating pattern corresponding to a desired grating in the scribe lines 54 of the wafer 50.

Figure 7:
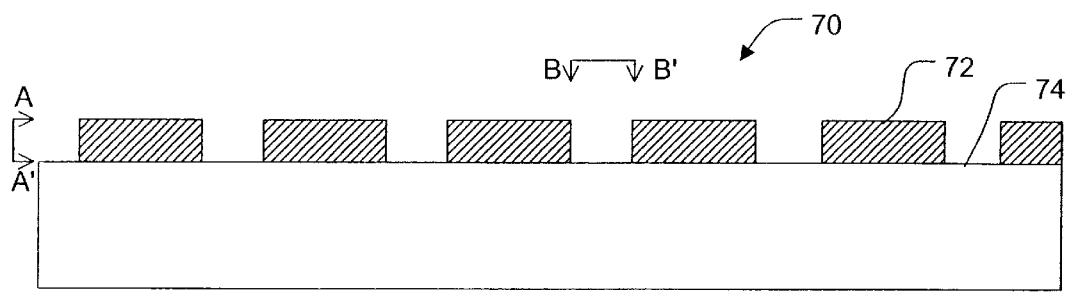
FIG. 7 is an illustration of a grating formed in a resist coating.

A grating that facilitates obtaining scatterometry data may have a simple structure and dimensions appropriate for determination by the scatterometry system 46. FIG. 7 provides an example of such a grating 70. The grating 70 is formed in a resist 72 on a substrate 74. Two exemplary dimensions that can vary in an uncontrolled manner and affect an implant process, such as an angled implant process, are indicated therein; one is the thickness of the resist 72, which is the distance A to A', and the other is the width of the pattern gaps, which is the distance B to B'.

Figure 8:
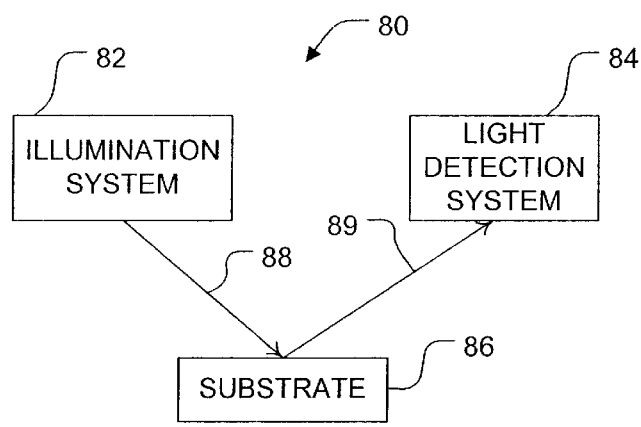
FIG. 8 is an illustration of a scatterometry system.

The scatterometry system 46 of FIG. 4 obtains data that relates to the dimensions of the resist. FIG. 8 illustrates an exemplary scatterometry system 80. The scatterometry system 80 includes an illumination system 82 and a light detection system 84. The illumination system 82 provides incident light 88 that scatters from a substrate 86 to produce scattered light 89. The scattered light 89 is detected by the light detection system 84 and provides data relating to the scattered light 89 to the controller 42.

The illumination system 82 and the light detection system 84 are components of a scatterometer. A scatterometer is a device that measures light scattered from a surface. Scattered light includes light that is reflected and or refracted from a surface, especially light reflected or refracted from a surface with periodic features, such as a grating. In the present invention, the term light is intended to include all forms of incident radiation. For a columnar light source, and where the surface is periodic, the scattered light is generally diffracted, producing a distinctive intensity distribution. The intensity is distributed with respect to angle of incidence, angle of reflection, wavelength of light, and polarity of light. The intensity distribution depends on a variety of surface characteristics, including composition and geometry.

Several types of scatterometry methodologies are available and any such methodology is contemplated as falling within the scope of the present invention. The methodologies can be divided according to the portion of the intensity distribution analyzed to obtain information about the surface. One exemplary methodology is 2-Θ scatterometry. Another exemplary methodology is specular spectroscopic scatterometry.

2Θ scatterometry is based on the intensity distribution of scattered light as a function of angle of incidence. Monochromatic radiation, such as laser light, is generally employed within an illumination system to generate an incident light on the sample surface. The scattered light is distributed into diffracted orders that are located according to the formula:

$$\sin\theta_i + \sin\theta_r = \frac{m\lambda}{d}$$

where $\theta_i$ is the angle of incidence (measured relative to a vector normal to the surface), $\theta_r$ is the angle of reflection, m is the diffraction order, $\lambda$ is the wavelength of light, and d is the period of the pattern being evaluated on the surface. The $0^{th}$ diffracted order (m=0) corresponds to specular reflection, that is, scattered light that has an angle of reflection mirroring the angle of incidence. The light intensity for at least one of the diffracted orders is measured. Obtaining light intensity data from several diffracted orders provides more information, but as the grating period, d, becomes small relative to the wavelength, $\lambda$, observing diffracted orders greater than the $0^{th}$ becomes progressively more difficult. In general, observing the light intensity in just one diffracted order, the $0^{th}$ order for example, is sufficient.

Where more data is desired, the intensities of the polar components of the scattered light can be examined separately. In particular, the TM component of scattered light (that with an electric field vibrating parallel to the surface) exhibits one intensity distribution with respect to angle of incidence. The TE component of scattered light (that with an electric field vibrating perpendicular to the surface) exhibits another intensity distribution with respect to angle of incidence. The TE and TM component distributions, taken together, provide more information about the surface than a single distribution that makes no distinctions based on polarity.

Specular spectroscopic scatterometry is based on the intensity distribution of the scattered light as a function of wavelength of incident light. Generally, only one angle of incidence is employed and only the $0^{th}$ diffracted order is considered, although additional data can be obtained using multiple angles of incidence and by examining diffracted orders other than the $0^{th}$. The advantage of using a single angle of incidence and examining only the $0^{th}$ diffracted order is that a single detector at a single position can be employed, thus simplifying the equipment. As with the 2-Θ technique, addition data can be obtained by separately examining the polar components of the scattered light. The light source can be monochromatic with variable wavelength. Alternatively, the light source can be polychromatic while the detection system separately detects the intensities of various wavelengths of light.

The incident light 88 is provided by the illumination system 82, which includes one or more light sources. Depending on the scatterometry technique employed, there can be one light source at a fixed position, one light source with a variable position, or a plurality of light sources with fixed or variable positions. Generally, a single light source is sufficient. The light source can be monochromatic or polychromatic (providing white light, for example). Generally, one or more apertures are used to provide light in a columnar beam. The beam is generally broad enough to simultaneously reflect from ten or more periodic elements, or a number sufficient to produce a clear diffraction pattern.

Light intensities for the scattered light 89 are measured by the light detection system 84, which includes one or more photodetectors, for example. As with the illumination system, depending on the technique involved, there can be one photodetector at a fixed position, one photodetector with a variable position, or a plurality of photodetectors with fixed or variable positions. The photodetectors can be, for example, photo-multipliers or photo-diode arrays. The light detection system 84 can also include one or more polarizing filters to select TE or TM components of the scattered light 89, as may be desired.

For some configurations, the illumination system 82 and the light detection system 84 may be commercially available as part of a scatterometry system. Equipment used for ellipsometry may also be suitable for scatterometry.

Data from the light detection system 84 is provided to the controller 42 of FIG. 4. The controller 42 can include a unit manufactured specifically to control wafer processing, although a general purpose computer system is more commonly employed. The controller 42 generally includes at least a computer system, with suitable hardware and software components.

The controller 42 employs the data from the light detection system 84 (light intensity data) to either determine a condition for an ion implantation process or determine whether a resist provided by the lithography system 44 is suitable for an ion implantation process. These determinations are generally made through estimating the resist dimensions from the scatterometry data. Alternatively these determinations can be made based on historical data that relates implantation process outcomes directly to the scatterometry data.

In principle, with a few simplifying assumptions, the resist dimensions can be determined directly from the intensity data, particularly where the resist is provided with a grating to facilitate scatterometry measurements. However, the mathematics are very difficult and it is generally more practical to create a database of light intensity profiles corresponding to various resist dimensions.

A database of light intensity profiles can be generated experimentally or a priori (by calculation). A priori approaches involve taking a description of the resist geometry, the surface composition, and the properties of the component materials, and generating light intensity profiles by one of several techniques mathematical techniques. In particular, Rigorous Coupled Wave Analysis (RCWA) or the Classical Model Method (CMM) can be employed in generating an a priori database that relates light intensity profiles to resist dimensions.

A database can also be generated experimentally. In the experimental approach, light intensity profiles are obtained for resists having various dimensions. Samples can be obtained by systematically generating resists with various dimensions. Another approach is to obtain light intensity profiles from production wafers and analyze the resist dimension, generally through destructive testing, whenever a resist is encountered that does not have a close match in the existing database.

The light intensity profiles can be tabulated against the various resist dimensions. The dimensions include at least one dimension that affects the outcome of an implant process. Generally, at least the resist thickness is tabulated. A feature size such as a gap width may be included as well.

Rather than tabulating the light intensity profiles against resist dimensions, the light intensity profiles alternatively can be tabulated against a more direct measure of how the resist will perform in an implant process. For example, a table can indicate whether a resist is suitable for a particular implant process, such as an angled implant process, and/or a condition to use for an implant process. The condition can be, for example, implantation dose or an energy of ions (which affects the mean depth at which the ions implant). Where the implant process is an angled implant process, the condition generally related to the angle of implantation.

A direct measure of how the resist will perform in an implantation process can be determined experimentally by carrying out implants, optionally with varying conditions. Where multiple conditions are investigated for each light intensity profile, the table can provide the conditions that give the best result as determined by a suitable method, such as analyzing implanted substrates with electrical force mode atomic force microscopy, for example.

Where resist dimensions are determined, the suitability of the resist for an implant process and/or a condition to use for an implant process can be either included in the database or calculated, based on the resist dimensions, by the controller 42. In either case, the suitability of the resist for an implant process and/or a condition to use for an implant process can be related to the resist dimensions using theoretical predictions.

After acquiring the scatterometry data, the controller 42 searches the database for a match to the light intensity profile. A match is defined in a statistical sense, such as Partial Least Squares or Minimum Mean Square Error. Several profiles, corresponding to similar surface geometries or multiple measurements of a single resist, may provide a good match to the data and the closest match may be selected. A minimum degree of similarity or correlation between the measurement and the closest database entry can be defined. Where the minimum is not met, the resist is considered unidentified and the controller 42 may act under the assumption that the resist is not suitable for use in an implant process.

When the controller 42 determines that the a resist is not suitable for use in an implant process, it may initiate remedial action. Remedial action can include, for example, one or more of halting processing of the affected wafers, stripping the resist coating, applying a new resist coating, and repeating the patterning process.

The ion implantation system 48 provides implants to substrates with resists having dimensions suitable for the implant process. Where the controller 42 determines a condition for the implant process, that condition is implemented by ion implantation system 48. The ion implantation system 48 includes apparatus that generates energetic ions and directs them against a substrate at a predetermined angle. For example, when the controller 42 identifies the height and/or gap width associated with a given patterned resist, the controller 42 then provides control data to the ion implantation system 48 such as dictating the appropriate implantation angle and/or implantation dose.

Figure 9:
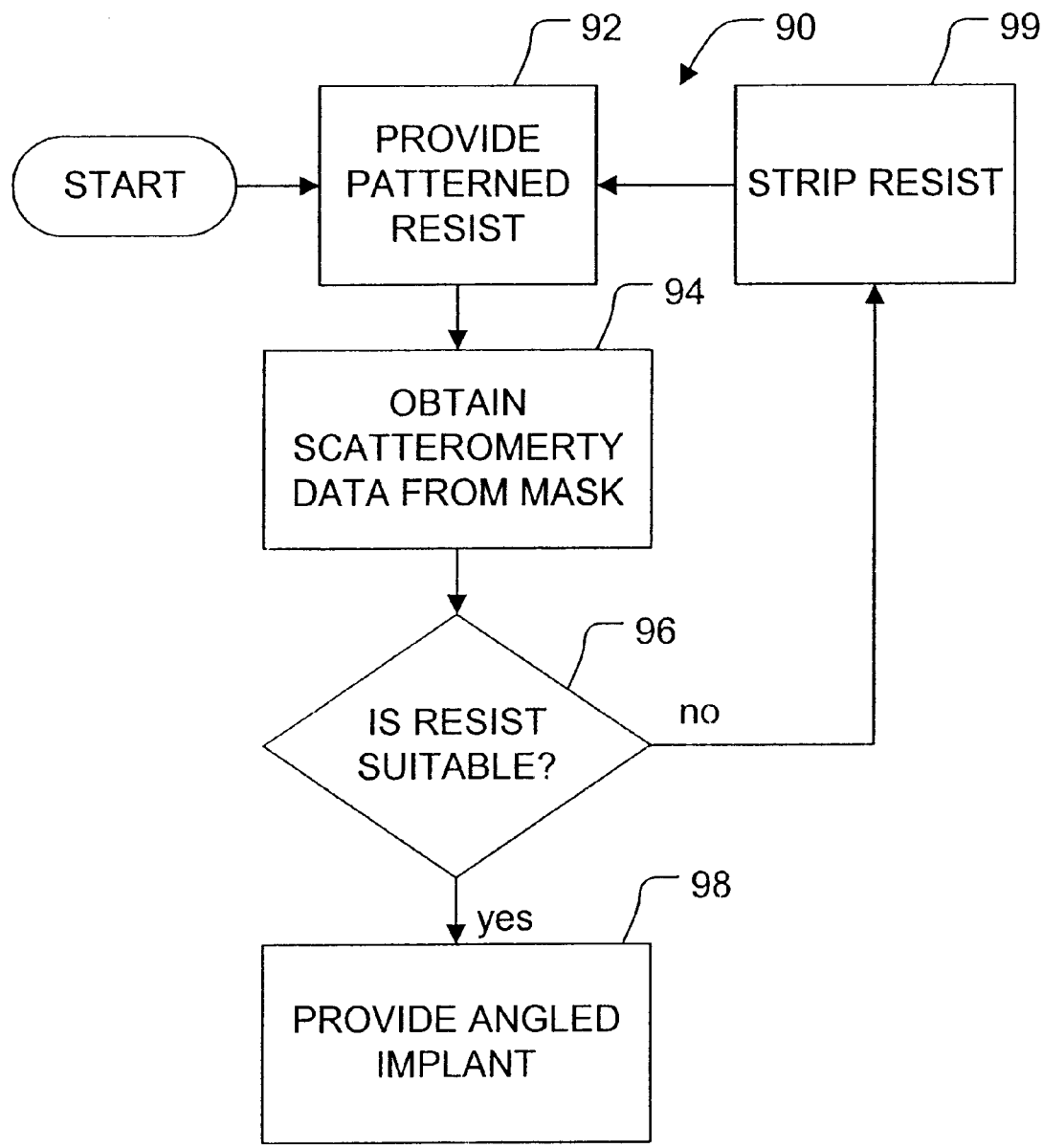
FIG. 9 is a flow diagram of a method of controlling an implant process according to another aspect of the present invention.

FIG. 9 is a flow chart of a process 90 according to another aspect of the present invention. Action 92 is coating a substrate with a patterned resist coating. Action 94 is obtaining scatterometry data from the patterned resist. The data is generally obtained from a portion of the patterned resist having periodic features. In some cases, a suitable set of periodic features can be found in a functional portion of the patterned resist, that is, a portion that provides features that are to become part of a finished device. In other cases, a suitable set of periodic features, such as a grating, can be provided in a non-functional portion of the resist coating specifically to facilitate obtaining scatterometry data.

Action 96 is determining from the scatterometry data whether the resist is suitable for use in a particular implant process, an angled implant process for example. If the resist is suitable, the process proceeds with action 98, which is providing the implant. If not, the process proceeds with action 99, which is stripping the resist, whereby a new patterned resist can be provided.

Figure 10:
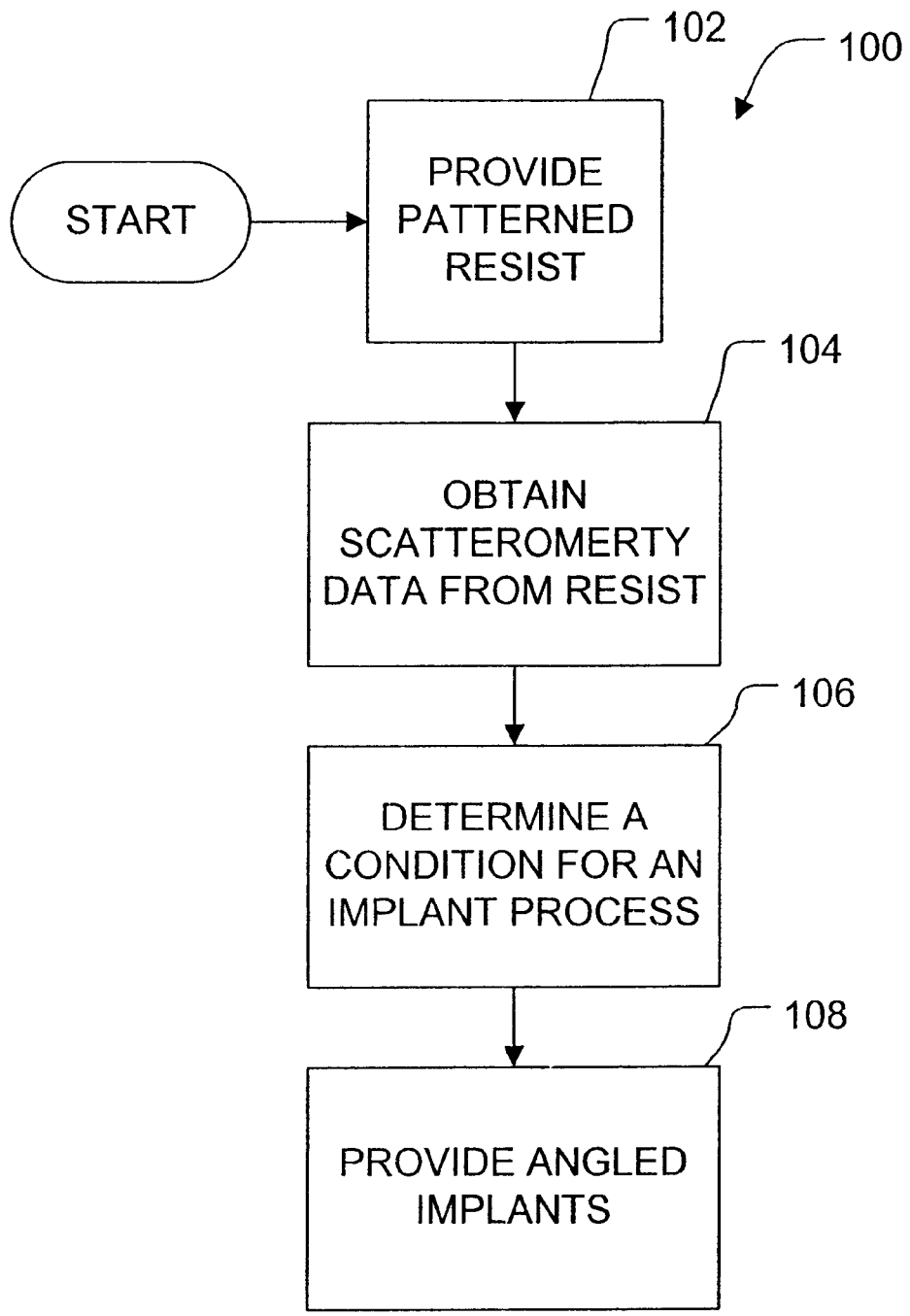
FIG. 10 is a flow diagram of a method of controlling an implant process according to a further aspect of the present invention.

FIG. 10 is a flow chart of a process 100 according to a further aspect of the present invention. Action 102 is coating a substrate with a patterned resist. Action 104 is obtaining scatterometry data from the patterned resist. Action 106 is determining from the scatterometry data a condition to use in an implant process. This determination can involve estimating resist dimensions, such as thickness, and calculating a condition, such as an implant angle or implantation dose, that will achieve a desired result. Action 108 applies the condition determined in action 106 in the implant process.

Although the invention has been shown and described with respect to certain embodiments, alterations and modifications providing equivalent structures and acts are likely to occur to those of ordinary skill in the art upon the reading and understanding this specification and the associated drawings. Such alterations and modifications are intended to fall within the scope of the present invention, unless expressly stated to the contrary. Components described in functional terms have structure and involve acts, unless otherwise indicated, corresponding to any of the devices and methods known to those of ordinary skill in the art to perform those functions, even though not equivalent to any of the structures and acts that perform those function in the exemplary embodiments of the invention. In addition, while a particular feature of the invention may have been disclosed with respect to only one of several embodiments, such feature may be combined with one or more other features of the other embodiments as may be desired or advantageous for a given or particular application.

What is claimed is:

1. A method of controlling an angled implant process, comprising:
   coating a substrate with a resist;
   patterning the resist;
   obtaining scatterometry data relating to the patterned resist; and
   determining from the scatterometry data whether the resist is suitable for the angled implant process.

2. The method of claim 1, wherein the resist is patterned with a grating to facilitate obtaining scatterometry data.

3. The method of claim 2, wherein the substrate is a wafer comprising functional regions and non-functional regions and the grating is formed in a non-functional region.

4. The method of claim 1, further comprising undertaking corrective action where it is determined from the scatterometry data that the resist is not suitable for the angled implant process.

5. The method of claim 4, wherein the corrective action comprises stripping the resist and coating the substrate with a new resist.

6. The method of claim 4, further comprising, where it is determined from the scatterometry data that the resist thickness is suitable for the angled implant process, further determining from the scatterometry data a condition to use in the angled implant process; and carrying out the angled implant process with the determined condition.

7. The method of claim 6, wherein the determined condition is an angle of incidence.

8. The method of claim 1, wherein determining whether the resist is suitable for the angled implant process comprises determining a thickness of the patterned resist.

9. A method of controlling an implant process, comprising:

coating a substrate with a resist;

patterning the resist;

obtaining scatterometry data relating to the patterned resist;

determining a condition to use for the implant process from the scatterometry data; and carrying out the implant process using the determined condition.

10. The method of claim 9, wherein the resist is patterned with a grating to facilitate obtaining scatterometry data.

11. The method of claim 10, wherein the substrate is a wafer comprising functional regions and non-functional regions and the pattern is formed in a non-functional region.

12. The method of claim 9, wherein the determined condition is an angle of incidence.

13. The method of claim 9, wherein determining the condition to use for the angled implant process comprises determining a thickness of the patterned resist.

14. The method of claim 9, wherein the determined condition is a line width.

15. The method of claim 9, wherein determining the condition to use for the angled implant process comprises determining an implantation dose.

16. A semiconductor processing system, comprising:

a lithography system that provides patterned resists on semiconductor substrates;

a scatterometry system that obtains data relating to the patterned resists;

a control system for analyzing the data to determine a condition for an ion implantation process; and an ion implantation system that provides implants to the substrates using the condition determined by the control system.

17. The system of claim 16, wherein the lithography system provides resists patterned with a grating that facilitates obtaining scatterometry data.

18. The system of claim 17, wherein the semiconductor substrates comprise functional regions and non-functional regions and the lithography system provides the grating in a non-functional region.

19. The system of claim 16, wherein the control system determines a thickness for the patterned resist in analyzing the data to determine the condition.

20. The system of claim 16, wherein the condition determined by the control system is an angle of incidence.

21. The system of claim 16, wherein the control system determines a line width for the patterned resist in analyzing the data to determine the condition.

22. The system of claim 16, wherein the condition determined by the control system is an implantation dose.

* * * * *